(12) United States Patent
Wiedenmann et al.

(10) Patent No.: US 11,555,649 B2
(45) Date of Patent: Jan. 17, 2023

(54) ELECTRICAL APPLIANCE HAVING ELECTRIC DEVICES IN A DISTRIBUTED ARRANGEMENT

(71) Applicant: BSH HAUSGERAETE GMBH, Munich (DE)

(72) Inventors: Matthias Wiedenmann, Neenstetten (DE); Harald Krauss, Aalen (DE); Thomas Werts, Kellmuenz (DE); Xiang Xiao, Nanjing (CN)

(73) Assignee: BSH Hausgeraete GmbH, Munich (DE)

( * ) Notice: Subject to any disclaimer, the term of this patent is extended or adjusted under 35 U.S.C. 154(b) by 849 days.

(21) Appl. No.: 16/468,915

(22) PCT Filed: Nov. 24, 2017

(86) PCT No.: PCT/EP2017/080399
§ 371 (c)(1),
(2) Date: Jun. 12, 2019

(87) PCT Pub. No.: WO2018/108491
PCT Pub. Date: Jun. 21, 2018

(65) Prior Publication Data
US 2020/0080770 A1    Mar. 12, 2020

(30) Foreign Application Priority Data

Dec. 12, 2016 (DE) ................. 10 2016 224 705.0

(51) Int. Cl.
*F25D 29/00* (2006.01)
*F25D 23/00* (2006.01)
(Continued)

(52) U.S. Cl.
CPC .......... *F25D 29/005* (2013.01); *F25D 23/00* (2013.01); *F25D 23/066* (2013.01);
(Continued)

(58) Field of Classification Search
CPC ...... F25D 29/005; F25D 23/966; H01R 13/46
(Continued)

(56) References Cited

U.S. PATENT DOCUMENTS

| 2,441,643 A | * | 5/1948 | Mickler | ............... H01R 13/447 |
| | | | | 174/67 |
| 3,179,852 A | * | 4/1965 | Seagreaves | .......... H01R 13/502 |
| | | | | 361/772 |

(Continued)

FOREIGN PATENT DOCUMENTS

| CN | 1898841 A | 1/2007 |
| CN | 102576954 A | 7/2012 |

(Continued)

*Primary Examiner* — Neil Abrams
(74) *Attorney, Agent, or Firm* — Laurence A. Greenberg; Werner H. Sterner; Ralph E. Locher

(57) ABSTRACT

A cable harness supplies a plurality of electric devices which are in a distributed arrangement in a device housing. A first connection point of the cable harness has a plug connector on the side of the cable harness. At least the electric devices which are supplied via the first connection point are connected to the first plug connector on the side of the cable harness by way of a device-side plug connector and an adapter that is plugged together with both plug connectors.

17 Claims, 3 Drawing Sheets

(51) Int. Cl.
  *F25D 23/06* (2006.01)
  *H01R 12/72* (2011.01)
  *H01R 13/46* (2006.01)
  *H01R 31/06* (2006.01)
  *H01B 7/00* (2006.01)
  *H01R 13/62* (2006.01)
  *H05K 1/02* (2006.01)
  *H05K 1/11* (2006.01)

(52) U.S. Cl.
  CPC ........... *H01R 12/721* (2013.01); *H01R 13/46* (2013.01); *H01R 31/06* (2013.01); *F25D 2400/40* (2013.01); *H01B 7/0045* (2013.01); *H01R 13/62* (2013.01); *H05K 1/0292* (2013.01); *H05K 1/117* (2013.01)

(58) Field of Classification Search
  USPC .................................................. 439/638, 502
  See application file for complete search history.

(56) References Cited

U.S. PATENT DOCUMENTS

| | | | | |
|---|---|---|---|---|
| 3,281,558 A * | 10/1966 | Weber | .................... | H01R 13/68 439/651 |
| 3,825,703 A | 7/1974 | Berthier | | |
| 4,006,959 A * | 2/1977 | Hopkins | .............. | H01R 13/629 439/571 |
| 4,218,110 A * | 8/1980 | Giannaula | .............. | H01R 31/00 439/651 |
| 4,360,241 A * | 11/1982 | Fukunaga | .............. | B60K 37/04 439/246 |
| 4,543,800 A * | 10/1985 | Mawby | ................. | F25D 23/028 439/31 |
| 4,838,175 A * | 6/1989 | Hauville | ................... | B01L 9/02 108/50.02 |
| 4,950,169 A * | 8/1990 | Martin | .................... | H01R 29/00 439/620.08 |
| 4,981,438 A * | 1/1991 | Bekhiet | ................. | H02B 1/202 439/502 |
| 4,986,762 A * | 1/1991 | Keith | ................... | G02B 6/3825 439/534 |
| 5,348,485 A * | 9/1994 | Briechle | ................. | H01R 25/14 439/121 |
| 5,507,668 A * | 4/1996 | Lambrinos | ............... | H02G 3/00 439/502 |
| 5,572,402 A * | 11/1996 | Jeong | .................... | G11B 33/124 |
| 5,626,479 A * | 5/1997 | Hughes | ................ | H01R 31/065 439/651 |
| 6,028,267 A * | 2/2000 | Byrne | .................. | H01R 13/518 174/59 |
| 6,101,819 A | 8/2000 | Onaka et al. | | |
| 6,159,041 A * | 12/2000 | Davis | .................. | H01R 13/5213 439/942 |
| 6,256,881 B1 * | 7/2001 | Starkey | ............... | B29C 33/0083 439/736 |
| 6,737,582 B2 * | 5/2004 | Van Lieu | ............. | H01R 9/2483 439/97 |
| 7,073,345 B2 | 7/2006 | Kentner et al. | | |
| 7,404,298 B2 * | 7/2008 | Kim | ........................ | F25D 23/12 312/405.1 |
| 7,520,758 B2 * | 4/2009 | Kim | ........................ | F25D 29/005 439/76.1 |
| 8,117,865 B2 * | 2/2012 | Allard | ...................... | F25D 23/04 62/449 |
| 8,299,656 B2 * | 10/2012 | Allard | .................... | F16M 13/02 307/154 |
| 8,573,988 B2 | 11/2013 | Fujikawa | | |
| 8,591,252 B2 * | 11/2013 | Allard | .................... | H01R 13/44 439/501 |
| 8,794,987 B2 * | 8/2014 | Classen | ............. | H01R 13/5219 439/189 |
| 2004/0248462 A1 * | 12/2004 | Dyer | ...................... | H01R 29/00 439/502 |
| 2008/0164758 A1 | 7/2008 | McCoy et al. | | |
| 2008/0180010 A1 * | 7/2008 | Iguchi | .................... | F25D 19/02 312/401 |
| 2011/0162884 A1 * | 7/2011 | Andersson | ............. | H01R 31/02 174/71 R |
| 2015/0194749 A1 | 7/2015 | Kim et al. | | |
| 2018/0359001 A1 | 12/2018 | Grosse | | |
| 2020/0080770 A1 * | 3/2020 | Wiedenmann | ........ | F25D 29/005 |

FOREIGN PATENT DOCUMENTS

| | | |
|---|---|---|
| DE | 10221898 A1 | 12/2003 |
| DE | 102013209747 A1 | 11/2014 |
| DE | 102014118597 A1 | 6/2016 |
| EP | 1167902 A2 | 1/2002 |
| JP | S6089669 A | 5/1985 |
| JP | H08205265 A | 8/1996 |
| JP | 2001116429 A | 4/2001 |
| JP | 2003065658 A | 3/2003 |

* cited by examiner

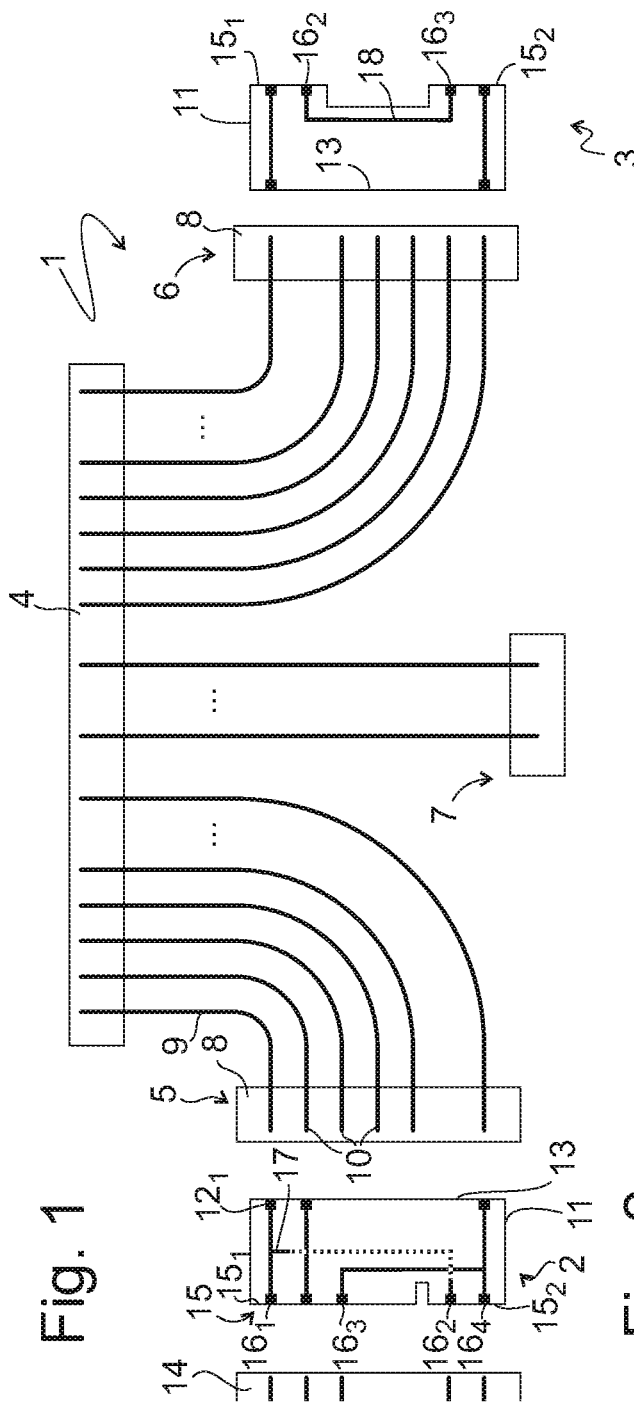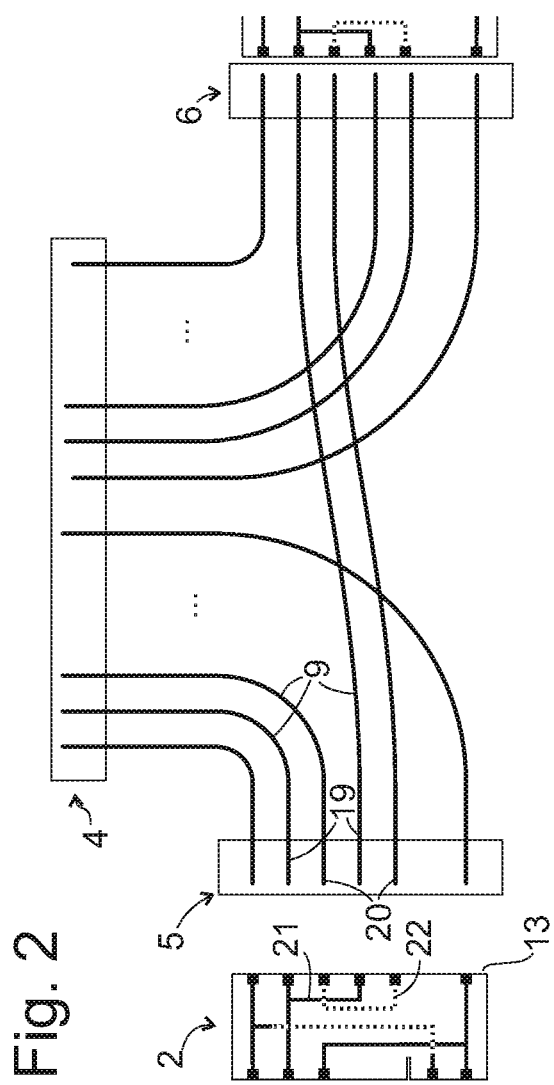

ELECTRICAL APPLIANCE HAVING ELECTRIC DEVICES IN A DISTRIBUTED ARRANGEMENT

BACKGROUND OF THE INVENTION

The present invention relates to an electrical appliance having multiple electric devices that are arranged distributed spatially spaced apart from one another in particular at different sites in an appliance housing. EP 1 167 902 A2 describes such an electrical appliance, wherein connection cables of the individual electric devices are plugged onto a central distribution box. The procedure of wiring such an appliance is considerably labor-intensive since it is necessary to locate and individually route for each electric device the respective matching cable which must then be connected to the distribution box and the electric device. For this reason, it has become common practice in many fields to use ready-made cable harnesses that are specific for each appliance in order to supply electrical energy to electric devices that are in a distributed arrangement in an electrical appliance and/or to transmit signals between the electric devices.

The various electric devices of such an electrical appliance may be many different types and the cables of the cable harness with which an electric device is to be connected are each different according to the type of device. In order to ensure that each electric device is correctly connected, the connection sites of a cable harness are conventionally equipped with different types of plugs that in each case only fit together with the complementary plugs of the particular electric devices for which they are provided.

One disadvantage of the cable harness arises from the fact that the electric devices that are to be installed at a specific site on the appliance housing may vary from one appliance to another. Thus, electric devices that have identical functions and are obtained from different sources and may be used as desired during the manufacture of the same model of electrical appliance differ with respect to the electric connections that they require. When manufacturing different models of the electrical appliance that are to be installed on an identical appliance housing, the electric devices that are to be installed at a specific site on the appliance housing may differ from model to model. In both cases, it is necessary for the plug of the cable harness that is to be placed on this installation site to have the respective necessary connections. As a consequence, it is necessary to manufacture and store many different models of the cable harness in order to select the respective matching cable harness for each individual electrical appliance that is to be manufactured while taking into consideration the electric devices that are to be installed on said electrical appliance. The diversity of models increases the costs of the cable harnesses and increases the outlay and the probability of errors when installing the electrical appliances.

Many cable harnesses require cables that extend between more than two connection sites. Such cables may be realized as Y-branches, wherein at least two cable sections are connected to one another at a branch of the cable harness, but it is complex and costly to realize such branches. Another possibility of forming such a cable is to connect two cable sections using an identical contact of a plug connector at a connection site of the cable harness but this increases the amount of installation space required by the contacts and makes the plug connector bulky.

SUMMARY OF THE INVENTION

The object of the invention is to provide an electrical appliance, wherein the diversity of models of the required cable harnesses may be reduced despite a complex construction with electric devices that are arranged distributed over different installation sites and despite the possibility that the electric devices at one installation site may vary from one appliance to the next.

The object is achieved in that, in the case of an electrical appliance having multiple electric devices, which are arranged distributed in an appliance housing, and having a cable harness that supplies the electric devices, at least a first connection site of the cable harness has a plug connector that is on the side facing the cable harness and the particular electrical devices that are supplied via the first connection site are connected to the plug connector that is on the side facing the cable harness via a plug connector that is on the side facing the device and via an adaptor that plugs together with the two plug connectors.

By virtue of the fact that the adaptor is inserted between the plug connector, which is on the side facing the cable harness, and the electric devices at at least one of these installation sites, it is possible to change the configuration to suit the electric devices that are to be connected at the individual installation sites. Since the adaptor is used to configure the connection to suit the electric devices that are provided at the installation site, the plug connector that is on the side facing the cable harness may be the same irrespective of the devices that are to be installed. This considerably reduces the diversity of models of the cable harness.

It is to be noted here that if the plural is used when referring to the electric devices of an installation site or to the electric devices that are connected to a plug connector that is on the side facing the cable harness, the number of these electric devices is completely non-specific and also the reference is to include the case that in each case only a single electric device is provided.

If such an adaptor is used at multiple connection sites of the cable harness, a single model of cable harness may be sufficient for all appliance models that are based on an identical appliance housing. This greatly simplifies the manufacturing procedure since it is not necessary at the time of installing the cable harness in an appliance housing to establish which electric devices are to be installed at the installation sites.

The adaptor may be realized in a particularly simple and space-saving manner as a circuit board; the plug connectors may then be edge plug connectors that are plugged onto contacts on the edges of the circuit board.

In the simplest case, the connection between two contacts on the circuit board is formed by means of a conductor track on the circuit board, however said connection may also be provided via a component that is soldered onto the circuit board. The contacts that are connected in this manner may be a contact that is on the side facing the cable harness and a contact that is on the side facing the device, however they may also be two contacts on the side facing the cable harness or two contacts on the side facing the device. The use of a component that is soldered onto said circuit board is particularly advantageous if it is necessary directly prior to or during the procedure of assembling the electric appliance for the adaptor to be reconfigured to suit the electric devices that are to be supplied by said adaptor.

In order also to be able to connect to one another electric devices that are connected to the same plug connector, the adaptor may have a conductor that connects to one another at least two contacts of the plug connector that is on the side facing the device. Such a conductor may be realized in particular on a circuit board with significantly less outlay than when realizing a conductor within the cable harness and such a conductor thus contributes to the simplification of its construction.

In order for a series connection of electric devices to be realized, it is possible for the conductor not to be connected to the plug connector that is on the side facing the cable harness; a conductor that is also connected to the plug connector that is on the side facing the cable harness is required for a parallel connection.

Such a series connection may be used to connect in series in particular a heater and a thermal cut-out, which monitors the function of the heater, with the result that a response of the thermal cut-out is able to terminate a current flow through the heater.

In order to transmit a signal or a supply voltage between more than two connection sites, a conventional cable harness must have a branched structure that is costly to produce. This outlay may be reduced according to the invention in that the adaptor has a conductor that connects to one another at least two contacts of the plug connector that is on the side facing the cable harness. It is then possible to provide in the cable harness a first cable that extends from a first of the two contacts of the plug connector that is on the side facing the cable harness to a second connection site, and to provide a second cable that extends from the second of the two contacts to a third connection site.

The plug connector that is on the side facing the cable harness may comprise in each case a single contact carrier to which all contacts of the plug connector are attached. This minimizes the number of components that are to be handled during the installation of the cable harness and renders possible an efficient installation procedure.

However, it may also be expedient to distribute the contacts of the plug connector that is on the side facing the cable harness on respective multiple contact carriers that may each be plugged individually to the adaptor. Although this increases the number of hand movements required for the installation procedure, it does however reduce the plugging forces required for the procedure.

If the appliance housing of the electric device is subdivided into multiple chambers, the electric devices that are to be supplied by the first connection site should be accommodated in a first of these chambers; respective dedicated connection sites may be provided for additional chambers.

The cable harness may be embedded in a layer of the appliance housing, said layer being formed from an insulating material.

In order to protect their contacts, the first connection site may comprise a connection housing that accommodates the plug connectors and the circuit board of the connection site.

In the case of an appliance housing that is subdivided into chambers, the connection housing of the first connection site is expediently installed on a wall of the first chamber, in other words the chamber in which the electric devices that are supplied by this connection site are located.

In order to specify the installation position of the capsule, the wall may have an opening.

Said opening should be tightly sealed by means of the capsule in particular in order to prevent insulating material from passing into the interior of the chamber if insulating material is applied to an outer face of the wall.

In order to facilitate such a sealing arrangement, the capsule may have a core region, which receives the plug connectors and the adaptor and engages in the opening, and a flange that extends around the core region and lies around the opening against the wall.

This flange should expediently also separate the cable outlets of the capsule that are on the side facing the cable harness and on the side facing the device.

BRIEF DESCRIPTION OF THE SEVERAL VIEWS OF THE DRAWING

Further features and advantages of the invention are disclosed in the following description of exemplary embodiments with reference to the attached figures. In the drawings:

FIG. 1 shows a schematic view of a cable harness having adaptors in accordance with a first embodiment of the invention;

FIG. 2 shows a schematic view of a cable harness having adaptors in accordance with a second embodiment of the invention;

DESCRIPTION OF THE INVENTION

Figure 3:
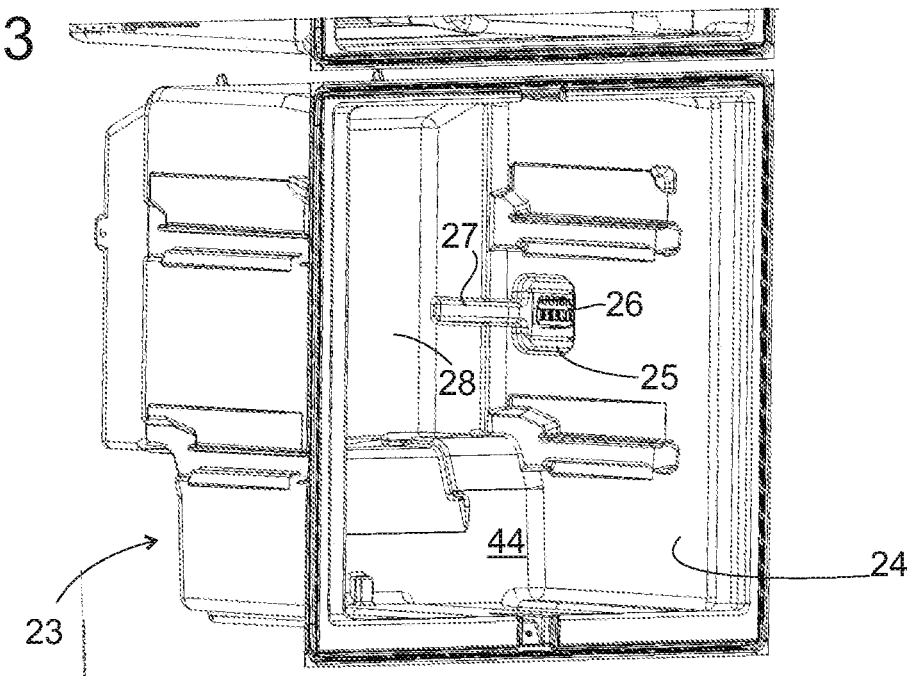
FIG. 3 shows a view of an interior container of a refrigerator having a connection site for the cable harness.

FIG. 1 illustrates a schematic view of an arrangement having a cable harness 1 and adaptors 2, 3 according to the invention. The cable harness 1 has a central and multiple peripheral connection sites 4, 5, 6, 7, . . . with plug connectors 8 that are on the side facing the cable harness and said cable harness has a multiplicity of cables 9 that are guided outward at each connection site 4, 5, 6, 7, . . . to a contact 10 of the plug connectors 8.

For example, a control unit of a refrigerator may be connected to the central connection site 4, wherein via the cable harness 1 said control unit supplies electric devices at different sites on the refrigerator with operating energy and control data or said control unit receives data from said electric devices. For example, electric devices that are arranged in a freezer compartment of the refrigerator may be connected to the cable harness 1 via the connection site 5, whereas electric devices of a normal refrigerator compartment are connected via the connection site 6. Additional connection sites 7, . . . may be provided as required for electric devices in additional freezer compartments for a user interface etc.

The cables 9 of the cable harness 1 do not have any branches; in other words each cable 9 connects precisely two contacts 10 of two plug connectors 8, one of which at the central connection site 4. A corresponding number of contacts 10 are provided at the central connection site.

Since the connected electric devices vary from one peripheral connection site 5, 6, 7 to another, the plug connectors 8 of the peripheral connection sites 5, 6, 7 may vary from one another. Moreover, the electric devices that are connected at each peripheral connection site may vary from one appliance to another and in particular may have different plugs. In order to be able to connect said electric devices to the plug connectors 8, an adaptor 2, 3 that is specific in each case for this connection site is provided at each peripheral connection site 5, 6, 7.

In order to limit the plugging-in forces that are required for plugging together the adaptors 2, 3 and the plug connectors 8, which are on the side facing the cable harness, the plug connector 8 may be divided into multiple contact carriers of which each one comprises only one part of the contacts 10 of the plug connector and which may be plug-connected in each case individually to the adaptor 2, 3. In order to be able to speed up the installation procedure, a construction is preferred, wherein all contacts 10 are combined in one single contact carrier.

The adaptors 2, 3 are preferably configured as circuit boards 11, and the plug connector 8 or the contact carriers which form the plug connector are edge plug connectors that are plugged onto these circuit boards 11 onto edges 13 that are provided with contact pads 12. In this case, it is not necessary for each contact 10 of the edge plug connectors to lie opposite a contact pad 12 of the adaptor 2, 3; in general contact pads 12 are allocated to only those contacts 10 that are actually used by the devices that are supplied via the relevant adaptor 2 or 3.

The plug connector 14 that is on the side facing the device is likewise configured as an edge plug connector that is preferably plugged onto an edge 15 of the adaptor 2 or 3, said edge lying opposite the edge 13. In a similar manner to the plug connector 8 that is on the side facing the cable harness, the plug connector 14 may comprise a single contact carrier in which cables of different electric devices come together; however it may also be expedient in this case if each electric device is connected in each case to a dedicated contact carrier and these may be plugged individually onto separate sections $15_1$, $15_2$ of the edge 15.

In order for example to direct to two electric devices a supply voltage that is supplied to the adaptor 2 at a single contact pad $12_1$, contact pads $16_1$, $16_2$ may be connected to the contact pad $12_1$ at the edge sections $15_1$, $15_2$ via a branching conductor track 17. It is significantly simpler and more cost-effective to realize such a branching arrangement on the circuit board 11 than to branch an individual cable within the cable harness.

By virtue of branching conductor tracks 17 on the circuit board 11 of the adaptor 2, it is rendered possible for example to provide a parallel supply to an electric device whose contact carrier is plugged onto the edge section $15_1$ and to an electric device having a contact carrier that is plugged onto the edge section $15_2$, in that both electric devices are connected via the contact pads $16_1$, $16_2$ to the supply voltage and via contact pads $16_3$, $16_4$ to ground.

The adaptor 3 has a conductor track 18 that connects contact pads $16_2$, $16_3$ to one another at separate sections $15_1$, $15_2$ of the edge 15 that is on the side facing the device but said conductor track does not have a connection to a contact pad at the edge 13 that is facing the cable harness 1. Such a conductor track 18 renders it possible to connect in series two electric devices that are supplied via the same adaptor 3, such electric devices being for example a door-opening switch and an interior lighting of a refrigerator or a defrost heater and a thermal cut-out that by virtue of opening a switch that is located therein may terminate the current flow through the defrost heater in the event of a limit temperature being exceeded.

FIG. 2 illustrates a cable harness 1 and adaptors 2, 3 in accordance with a second embodiment of the invention. The large number of contacts 10 at the central connection site 4 of the cable harness 1 in FIG. 1 is reduced here in that there are no multiple cables 9, which convey an identical signal or an identical supply voltage, running from the central connection site 4 to different peripheral connection sites but rather one such cable 9 runs from the connection site 4 initially to a contact 19 of the connection site 5, the contact 19 is connected to a second contact 20 of the connection site 5 via a conductor track 21 or 22 of the adaptor 2 that is installed at the connection site 5 and an additional cable 9 extends from the contact to the connection site 6.

As indicated in FIGS. 1 and 2 by means of a run of the conductor tracks 17, 21 22, in part a dashed line, it may be necessary that conductor tracks of the adaptors 2, 3 cross one another without being galvanically connected. Such conductor tracks may be structured on different sides of the circuit boards 11; they may also be configured as bridges that are installed, for example soldered, on the circuit board 11. The use of bridges renders it possible in particular to integrate a seldom integrated accessory into the refrigerator since by means of adding the bridges it is possible to reconfigure an existing adaptor to suit such an accessory.

FIG. 3 illustrates a perspective view of an interior container 23 of a lower chamber 44 in a combination refrigerator. An interior container of an upper chamber is represented in a fragmented manner. A bulge 25 is formed on a side wall 24 of the interior container 23; an opening 26 into the outer wall is cut into the base of the bulge and parts of a connection site such as of the connection site 5 from FIG. 1 or 2 may be viewed through said opening. In the case of a completely installed refrigerator, the bulge 25 provides space for electric devices, such as for example a temperature sensor or an interior lighting. A channel 27 runs from the bulge 25 to a rear wall 28 of the interior container. If in the case of an installed refrigerator the interior of the interior container is subdivided into a storage compartment and an evaporation chamber, cables run via the channel 27 from electric devices to the evaporation chamber, such as for example a fan, an evaporation temperature sensor, a defrost heater etc.

Figure 4:
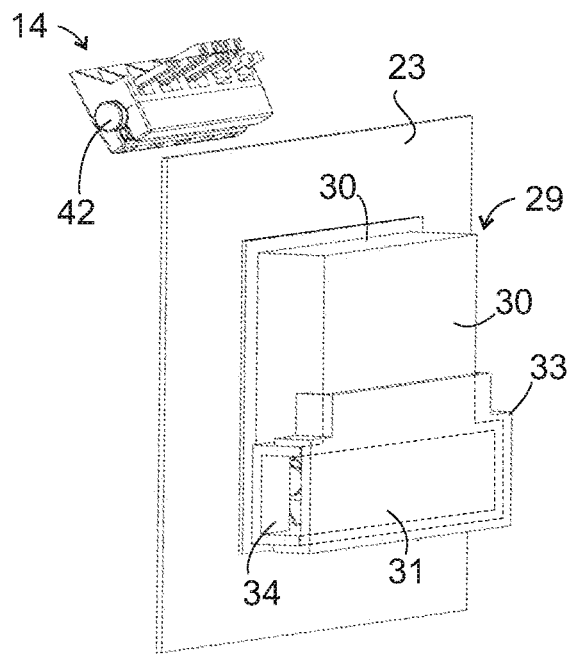
FIG. 4 shows an external view of the connection site.

FIG. 4 illustrates a view of the base of the bulge from outside. The opening 26 is covered by a connection housing 29. The connection housing 29 comprises a main part 30 that is latched to the interior container 23 in a manner that is to be described in more detail below and said main part has on its side that faces away from the interior container and is adjacent to a rear wall 32 an elongated opening 31 that is illustrated in FIG. 4 by a dashed line, and a cover 33 that seals the opening 31 and together with the main part delimits a side cable outlet 34. The cable outlet 34 is empty in the illustration in FIG. 4; in practice a plug connector 8 that is on the side facing the cable harness is inserted through the opening 31 into the main part 30 prior to installing the cover 33 in the illustrated position on the main part 30 and the cable outlet 34 is sealed in a foam-tight manner by a branch of the cable harness 1 that issues from the plug connector 8 and by a seal that surrounds the branch in order to prevent foam penetrating the connection housing 29 or the interior container 23 itself if, as is customary in the industry, a layer of heat-insulating foam material is applied to the outer faces of the interior container 23.

Figure 5:
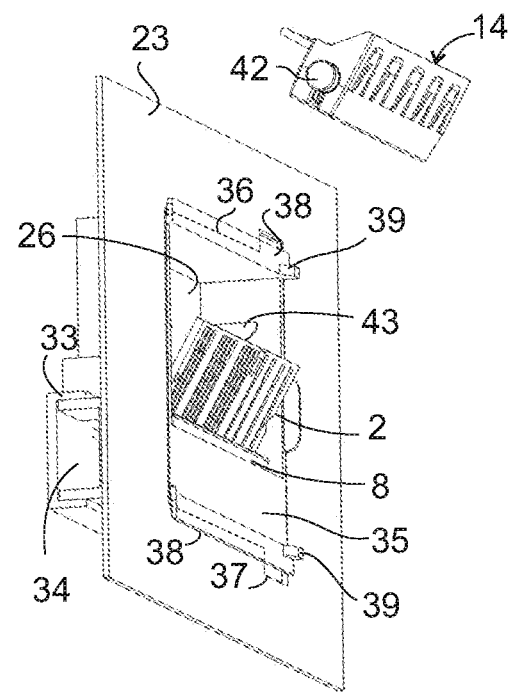
FIG. 5 shows an internal view of the connection site at which a plug connector that is on the side facing the device is separated from the adaptor and from the plug connector that is on the side facing the cable harness.

FIG. 5 illustrates the connection housing 29 that is installed in the opening 26 in a view from the inside. A front wall 35 of the main part 30, said front wall being flush with the interior container 23, covers the plug connector 8 to a great extent. The adaptor 2 that is inserted into the plug connector 8 protrudes in an oblique manner through the opening 26. In a left-hand section of the opening 26, the upper and lower edge 36, 37 of said section are bent behind two connecting pieces 38 that protrude from the main part 30 in the upward and downward direction. The edges 36, 37 are exposed in a narrow right-hand section of the opening 26.

The connection housing 29 is installed in the opening 26, wherein the connecting pieces 38 that are inserted from the outside are guided with their left-hand end at the front through the wide section of the opening 26 and the main part 30 lying against the interior container 23 is then displaced until the connecting pieces 38 have completely passed through the opening 26 and a latching protrusion 39 that is formed on the right-hand end of the connecting pieces 38 latches with the right-hand edge of the opening 26.

Figure 6:
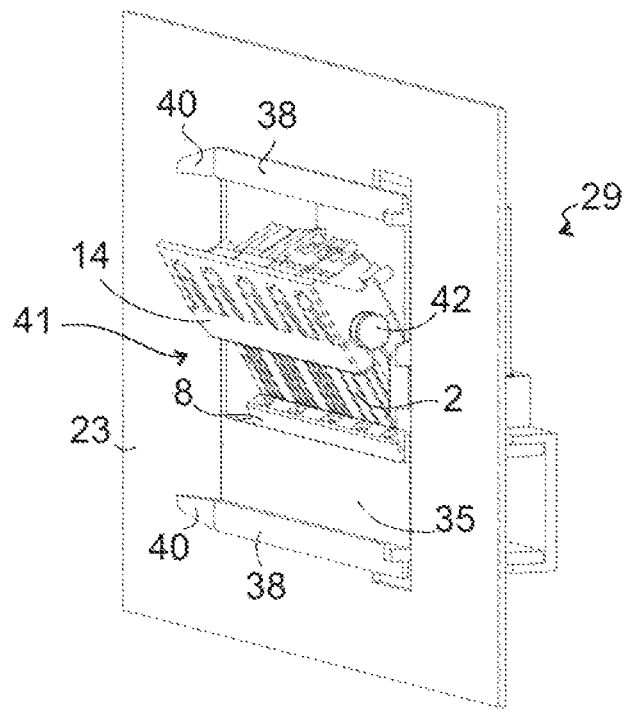
FIG. 6 shows the connection site of FIG. 5 with the plug connector that is on the side facing the cable harness plugged onto the adaptor.

In order to facilitate the procedure of inserting the connecting pieces 38 into the opening 26, the connecting pieces 38 may be provided with insertion aids 40 on their ends that are to be inserted first into the opening 26, as illustrated in FIG. 6, said insertion aids extending the connecting pieces 38 in a similar manner to the tips of skis and once attached in the opening 26 protrude in an oblique manner from the interior container 23.

Moreover, in FIG. 6 the plug connector 14 that is on the side facing the device and is still separate in the illustration in FIG. 5 is plugged on to the adaptor 2. In the next step, the assembly 41 comprising the adaptor 2 and plug connectors 8, 14 is pivoted into the connection housing 29 with the result that, as illustrated in FIG. 7, the adaptor 2 assumes an essentially vertical orientation and also the plug connector 14 completely disappears into the connection housing 29 and only the cables (not illustrated in FIG. 7) that extend from said connection housing to the electric devices that are installed in the interior container extend through the opening 26.

Figure 7:
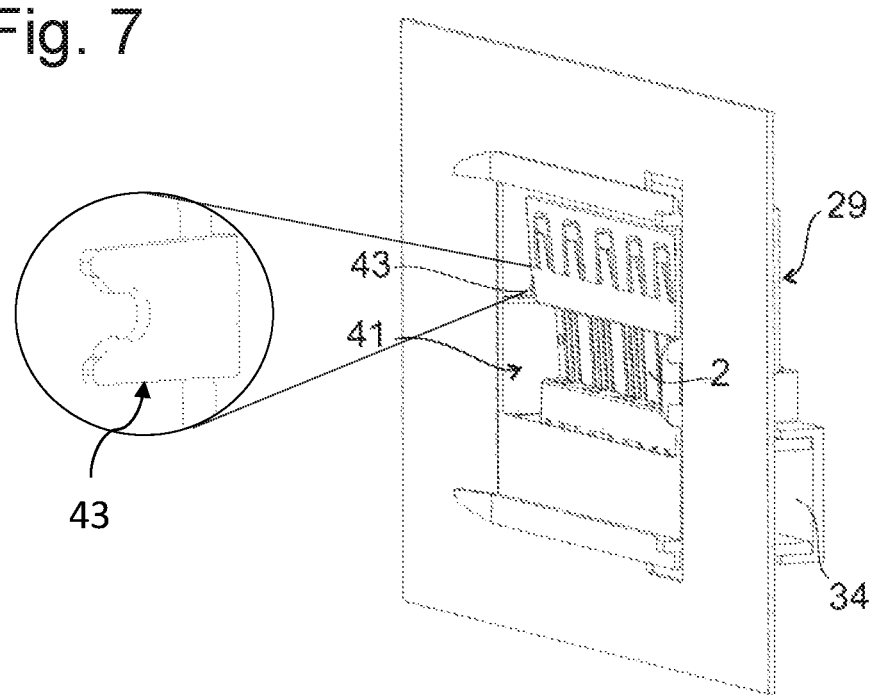
FIG. 7 shows the connection site with plug connectors that are sunk into the connection housing.

In order on the one hand to fix the assembly 41 in the position illustrated in FIG. 7 and on the other hand to ensure that the assembly 41 may only be pivoted into the position illustrated in FIG. 7 if the plug connectors 8, 14 and the adaptor 2 are plugged together to a sufficient extent in order to ensure a reliable electrical contact, the plug connector 14 may be provided with two lateral protrusions 42, and the connection housing 29 has two forks 43 that protrude toward the opening 26 from its rear wall 32 adjacent to the right-hand and left-hand edge of said rear wall and in FIGS. 5 and 7 respectively only the tip of a prong is visible. The distance of the forks 43 from a lower face of the connection housing that is supporting the plug connector 8 is selected such that the protrusions 42 may only slide between the prongs of the forks 43 if the plug connectors 8, 14 and the adaptor 2 are correctly plugged together. The distance between the prongs is selected such that they clamp at least in a friction-locking manner a protrusion 42 that is inserted between said prongs; they may also be undercut in order to render possible a positive-locking engagement of the protrusion 42. Insertion slopes at the tips of the prongs facilitate the insertion of the protrusions 42.

LIST OF REFERENCE NUMERALS

1 Cable harness
2 Adaptor
3 Adaptor
4 Connection site
5 Connection site
6 Connection site
7 Connection site
8 Plug connector that is on the side facing the cable harness
9 Cable
10 Contact
11 Circuit board
12 Contact pad
13 Edge
14 Plug connector that is on the side facing the device
15 Edge
16 Contact pad
17 Conductor track
18 Conductor track
19 Contact
20 Contact
21 Conductor track
22 Conductor track
23 Interior container
24 Side wall
25 Bulge
26 Opening
27 Channel
28 Rear wall
29 Connection housing
30 Main part
31 Opening
32 Rear wall
33 Cover
34 Cable outlet
35 Front wall
36 Upper edge
37 Lower edge
38 Connecting piece
39 Latching protrusion
40 Insertion aid
41 Assembly
42 Protrusion
43 Fork
44 Chamber

The invention claimed is:

1. An electrical appliance, comprising:
a plurality of electric devices distributed within an appliance housing;
a cable harness for supplying said electric devices, said cable harness having a first connection site with a plug connector; and
an adapter disposed to connect said plug connector of said cable harness together with a device-mounted plug connector connected to supply particular electric devices of said plurality of electrical devices;
said first connection site comprises a connection housing that accommodates said plug connector of said harness, said device-mounted plug connector, and said adaptor of said connection site, and said connection housing of said first connection site is installed on a wall of a chamber of the electrical appliance.

2. The electrical appliance according to claim 1, wherein said plug connector of said cable harness and said device-mounted plug connector are edge plug connectors and said adapter is a circuit board, and said circuit board has edges carrying contacts that are plugged onto said edge plug connectors.

3. The electrical appliance according to claim 2, wherein said adapter has at least two contacts connected via a component that is soldered onto said circuit board.

4. The electrical appliance according to claim 1, wherein said adapter includes a conductor interconnecting at least two contacts of said device-mounted plug connector to one another on a side facing a respective said device.

5. The electrical appliance according to claim 4, wherein said conductor is not connected to said device-mounted plug connector on a side facing said cable harness.

6. The electrical appliance according to claim 4, wherein said conductor is connected to said device-mounted plug connector on a side facing said cable harness.

7. The electrical appliance according to claim 1, wherein said adapter includes a conductor that connects to one another at least two contacts of said plug connector of said cable harness.

8. The electrical appliance according to claim 7, wherein said cable harness has a first line that extends from a first of said two contacts of said plug connector of said cable harness to a second connection site, and said cable harness has a second line that extends from a second of said two contacts to a third connection site.

9. The electrical appliance according to claim 1, wherein said plug connector of said cable harness comprises a single contact carrier to which all contacts of said plug connector are attached.

10. The electrical appliance according to claim 1, wherein said plug connector of said cable harness comprises contacts distributed on a plurality of contact carriers.

11. The electrical appliance according to claim 1, wherein said appliance housing is divided into multiple chambers including a first chamber, and wherein said electric devices that are supplied by said first connection site are accommodated in said first chamber.

12. The electrical appliance according to claim 1, wherein said appliance housing includes insulating material formed in a layer, and said cable harness is embedded in said layer of said appliance housing.

13. The electrical appliance according to claim 1, wherein said appliance housing is divided into multiple chambers including a first chamber, wherein said electric devices that are supplied by said first connection site are accommodated in said first chamber, and wherein.

14. The electrical appliance according to claim 13, wherein said connection housing is configured to completely fill an opening formed in said wall.

15. The electrical appliance according to claim 14, wherein said connection housing is insertable into said opening by way of a displacement in a direction parallel to a surface of said wall and said connection housing has two edge connecting pieces that are guided through a wide section of said opening transversely with respect to a direction of the displacement and, in an installed state on said wall, said connection housing lies against both sides of a narrow section of said opening.

16. The electrical appliance according to claim 15, wherein said connection housing is open toward said first chamber and said plug connectors and said adapter are pivotable between one position in which they are received in said connection housing and one position in which at least said plug connector that is on the side facing the device protrudes out of said connection housing into said first chamber.

17. The electrical appliance according to claim 1 configured as a refrigerator.

* * * * *